United States Patent [19]

Tennant

[11] 4,321,416
[45] Mar. 23, 1982

[54] PHOTOVOLTAIC POWER GENERATION

[75] Inventor: Robert J. Tennant, Seminole, Fla.

[73] Assignee: AMP Incorporated, Harrisburg, Pa.

[21] Appl. No.: 216,726

[22] Filed: Dec. 15, 1980

[51] Int. Cl.³ .............................................. H01L 31/04
[52] U.S. Cl. ...................................... 136/244; 29/572; 52/173 R; 136/291
[58] Field of Search ............. 136/244, 291; 52/173 R; 29/572

[56] References Cited

U.S. PATENT DOCUMENTS

| | | | |
|---|---|---|---|
| 3,912,539 | 10/1975 | Magee | 136/244 |
| 4,040,867 | 8/1977 | Forestieri et al. | 136/244 |
| 4,080,221 | 3/1978 | Manelas | 136/248 |
| 4,089,705 | 5/1978 | Rubin | 136/244 |
| 4,189,881 | 2/1980 | Hawley | 52/220 |
| 4,204,523 | 5/1980 | Rothe | 126/450 |
| 4,234,351 | 11/1980 | Deminet et al. | 136/251 |

FOREIGN PATENT DOCUMENTS

| | | | |
|---|---|---|---|
| 1900069 | 9/1970 | Fed. Rep. of Germany | 136/244 |
| 2806810 | 8/1979 | Fed. Rep. of Germany | 136/291 |

OTHER PUBLICATIONS

A. Kirpich, et al., "Performance and Cost Assessment of Photovoltaic Systems Concepts", *Conf. Record, 12th IEEE Photovoltaic Specialists Conf.* (1976), pp. 673-680.

*Primary Examiner*—Aaron Weisstuch
*Attorney, Agent, or Firm*—Frederick W. Raring

[57] ABSTRACT

A photovoltaic module is disclosed in the form of a shingle having an active portion containing photovoltaic cells and an inactive mounting portion. Flat flexible ribbon-like positive and negative leads extend from the terminals in the active portion. The individual modules are mounted on a surface by means of fasteners extending through the inactive portions of the modules. At the time of installation, the flexible leads are folded to provide a servicing loop and the ends of the leads are then connected into the electrical network of the system. Individual modules can be removed from the system by moving the modules in their own planes away from the array of modules with accompanying straightening of the loops so that modules can be replaced. Improved circuit arrangements for connecting modules in an array and improved installation methods are disclosed which take advantage of the flat flexible conductors extending from the modules.

17 Claims, 16 Drawing Figures

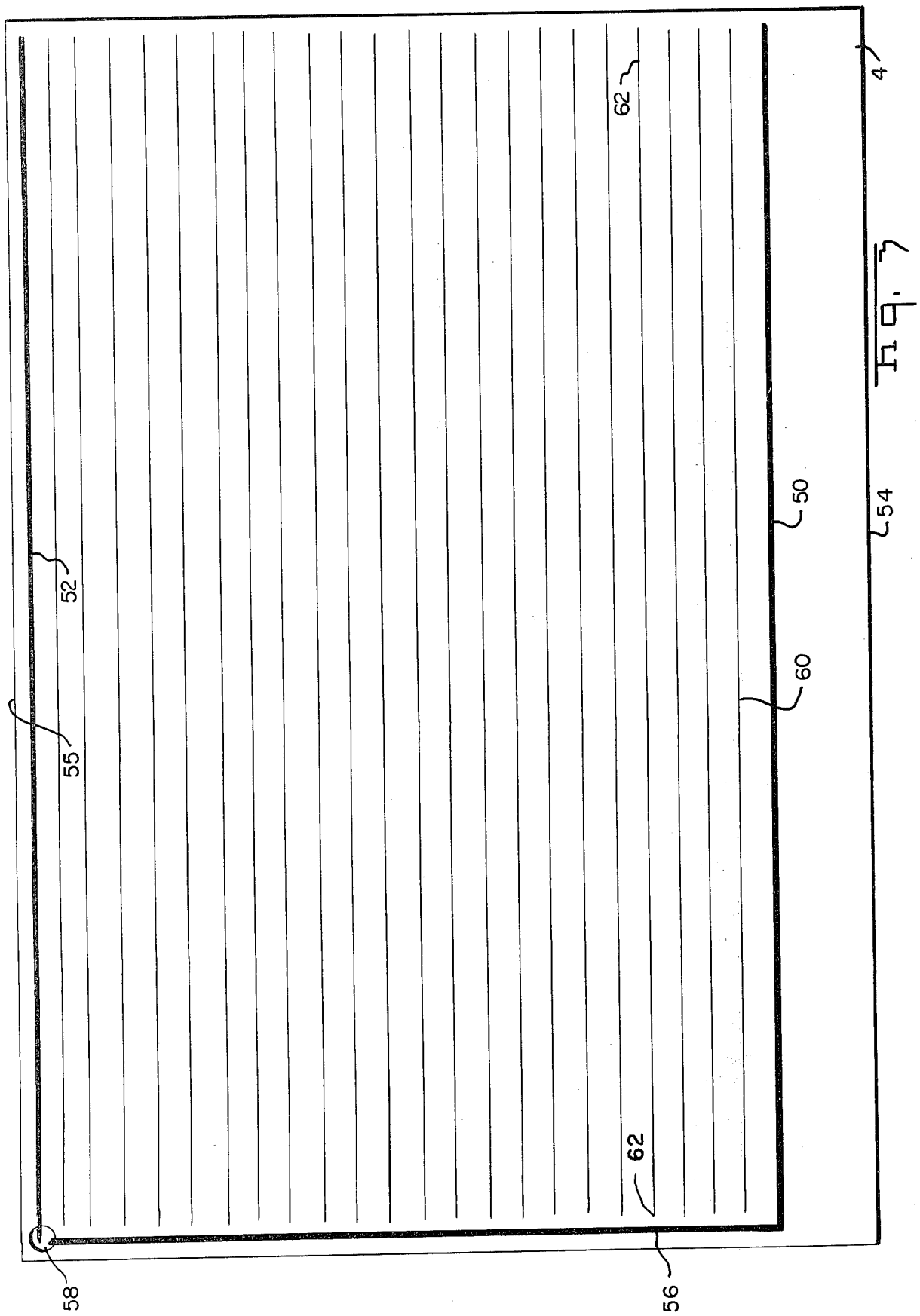

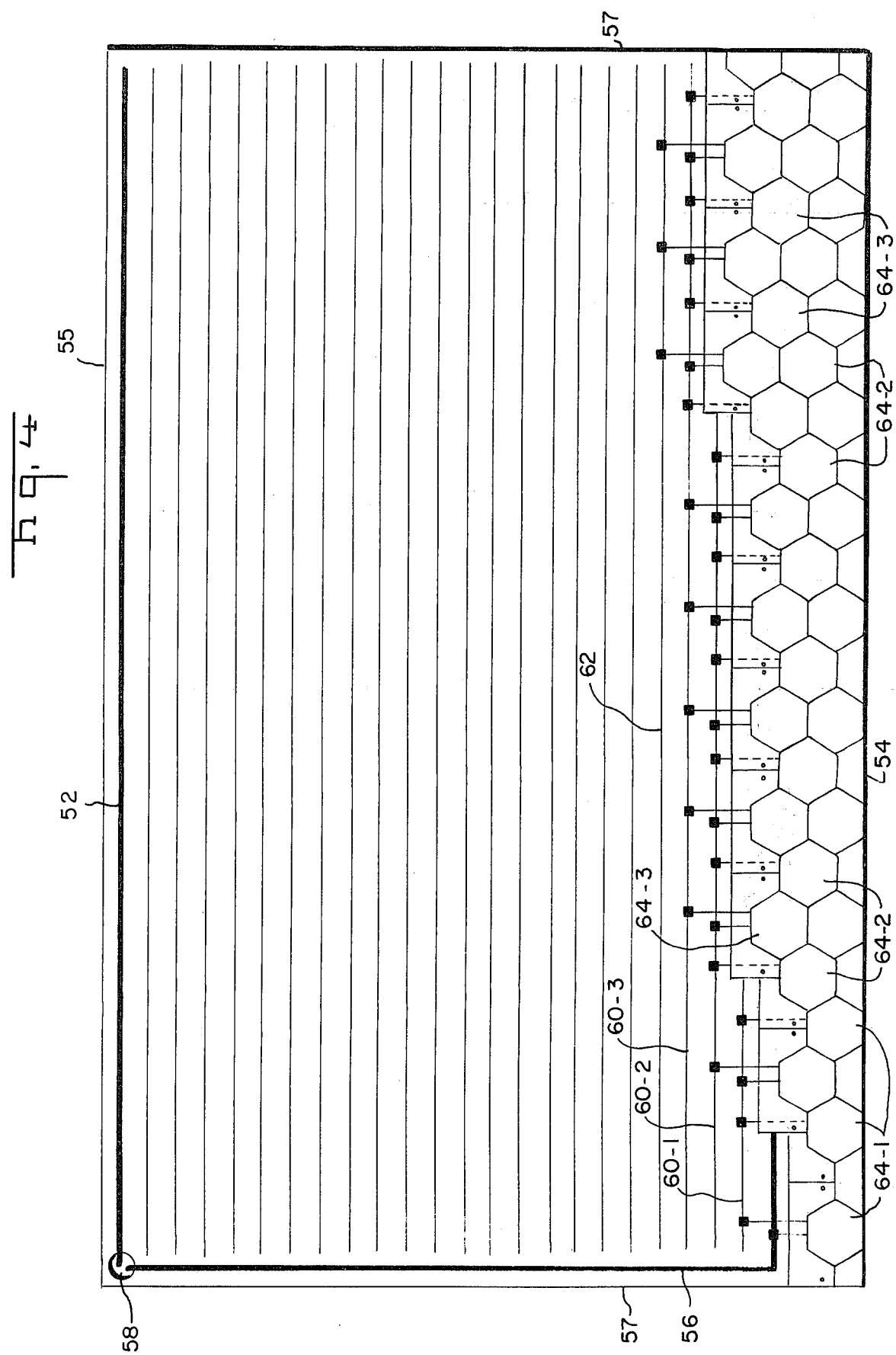

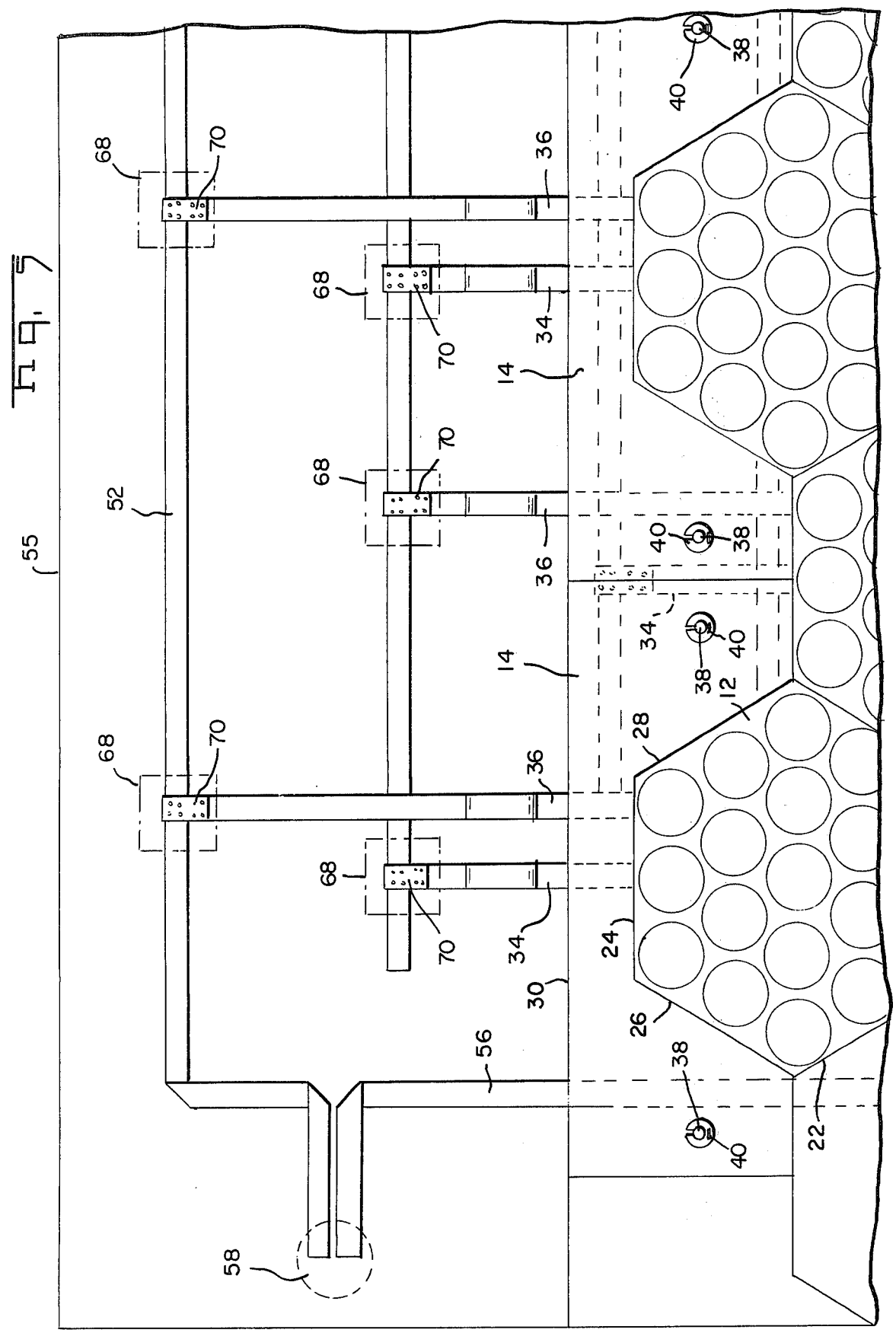

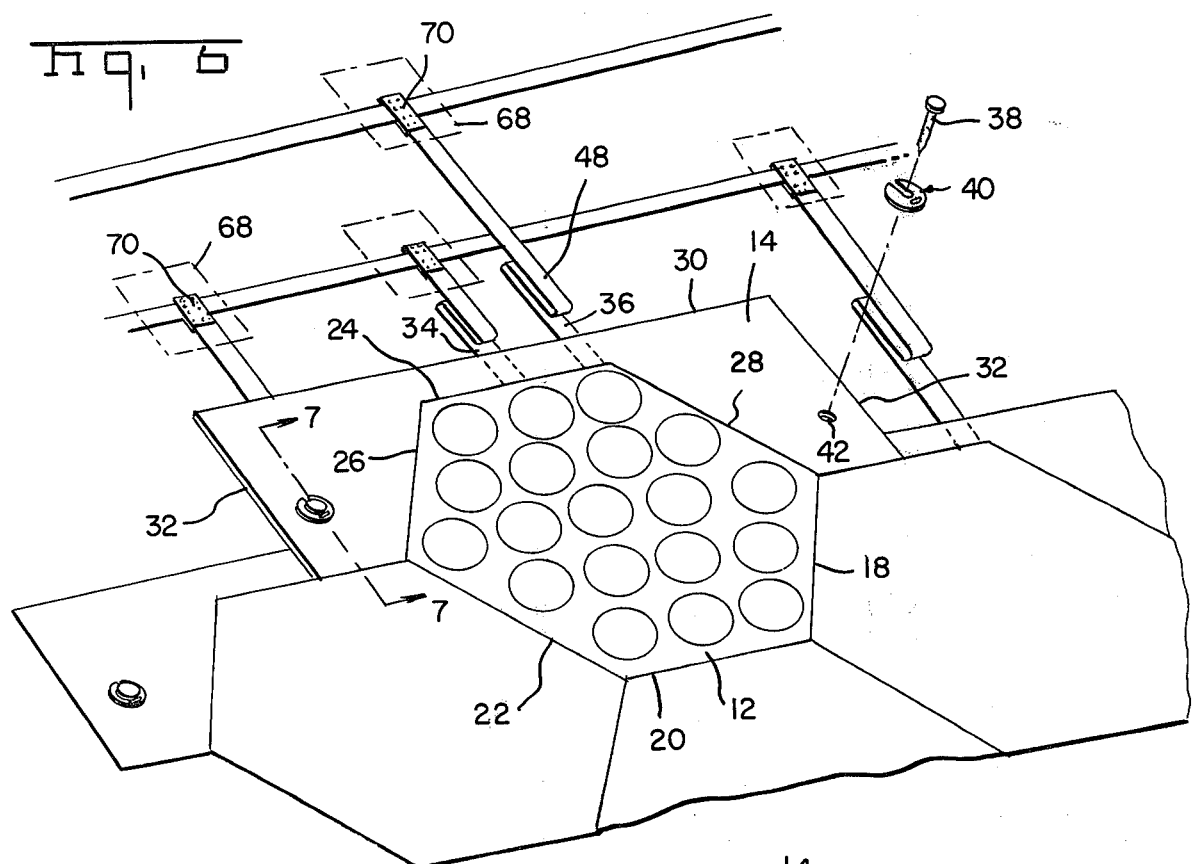
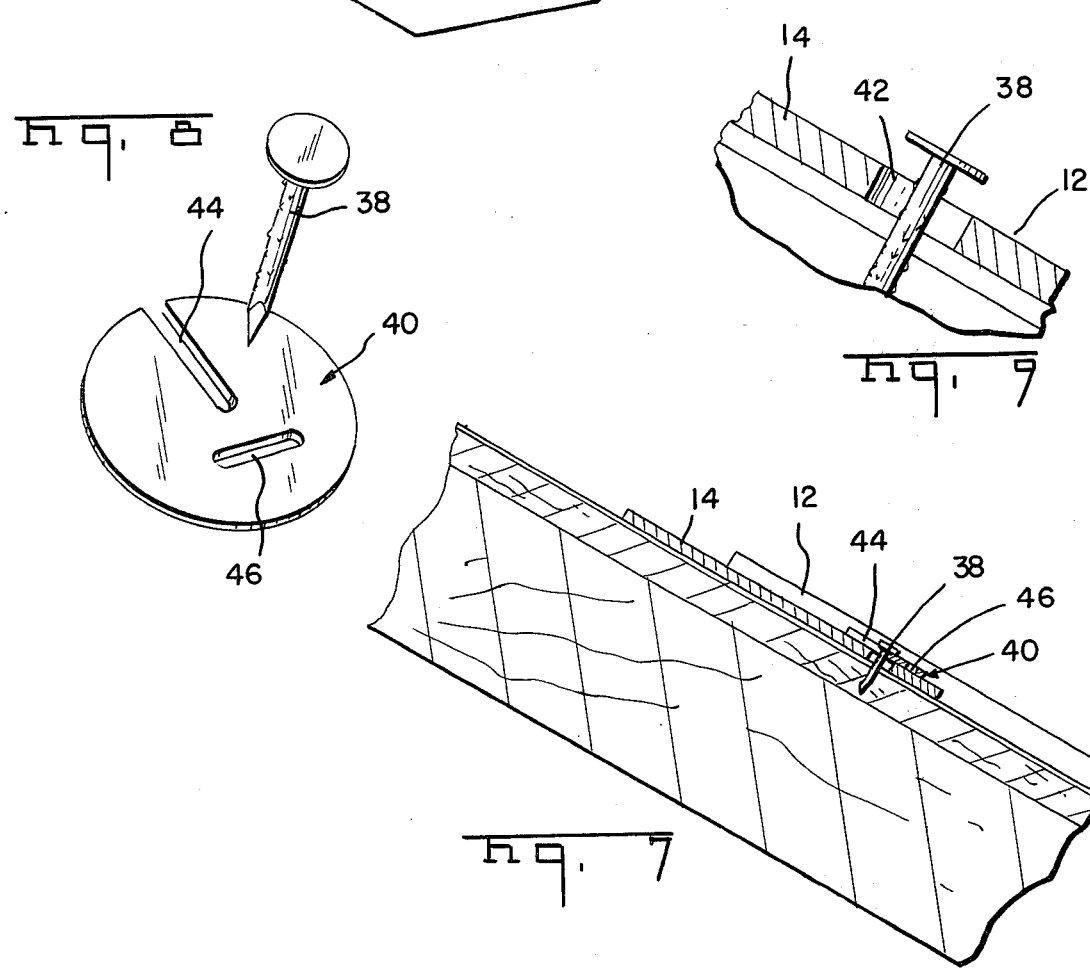

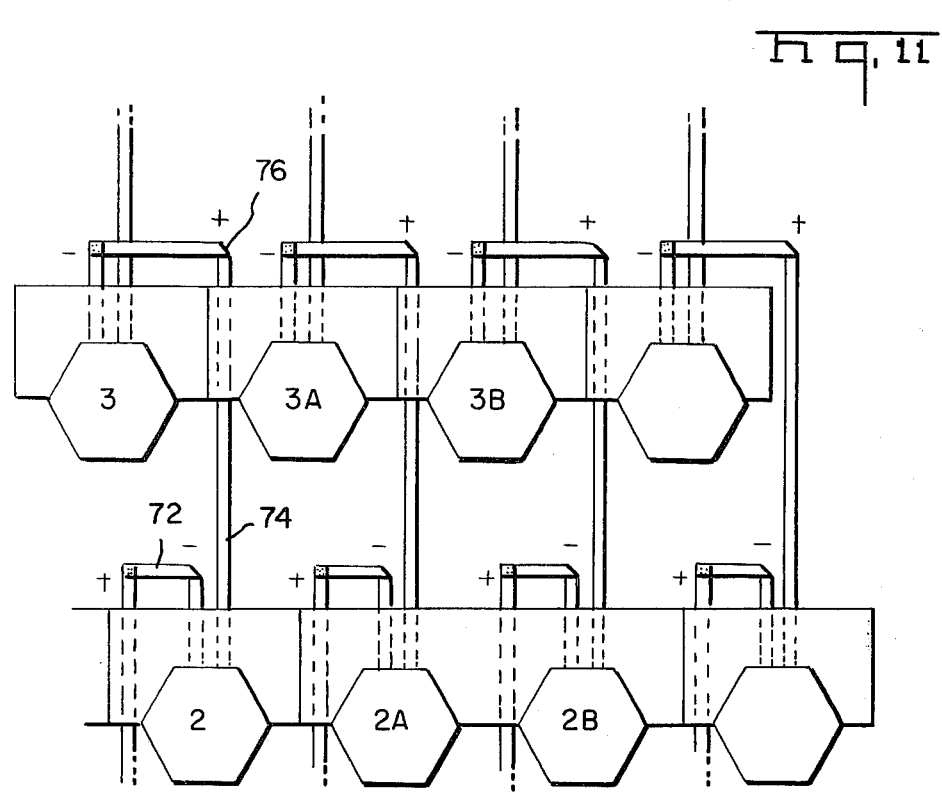
Fig. 11
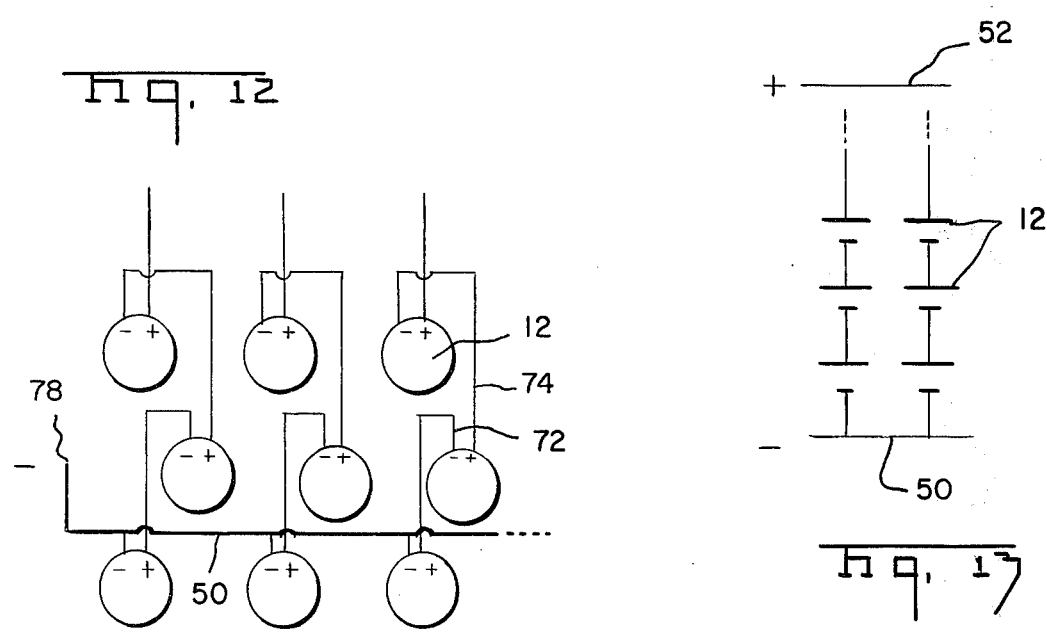
Fig. 12
Fig. 13

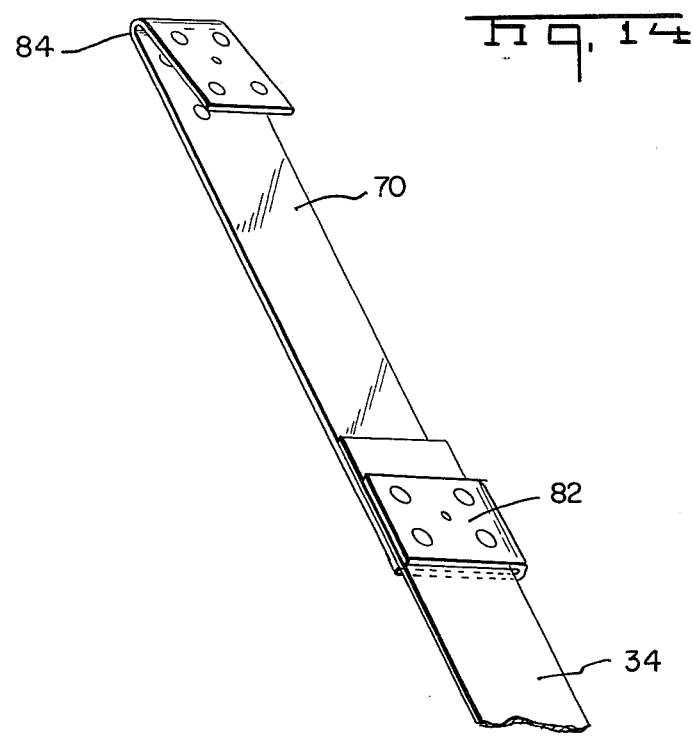
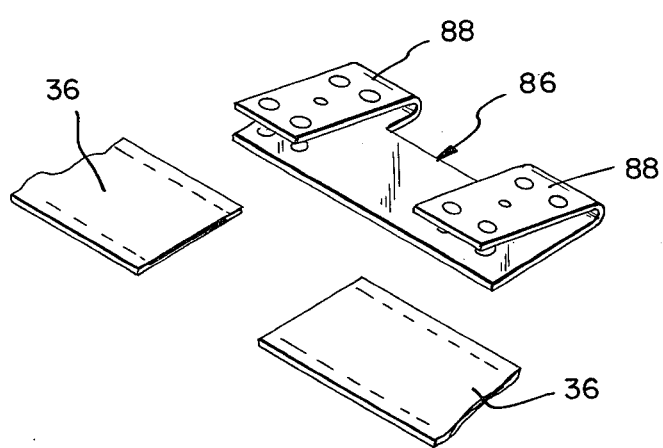

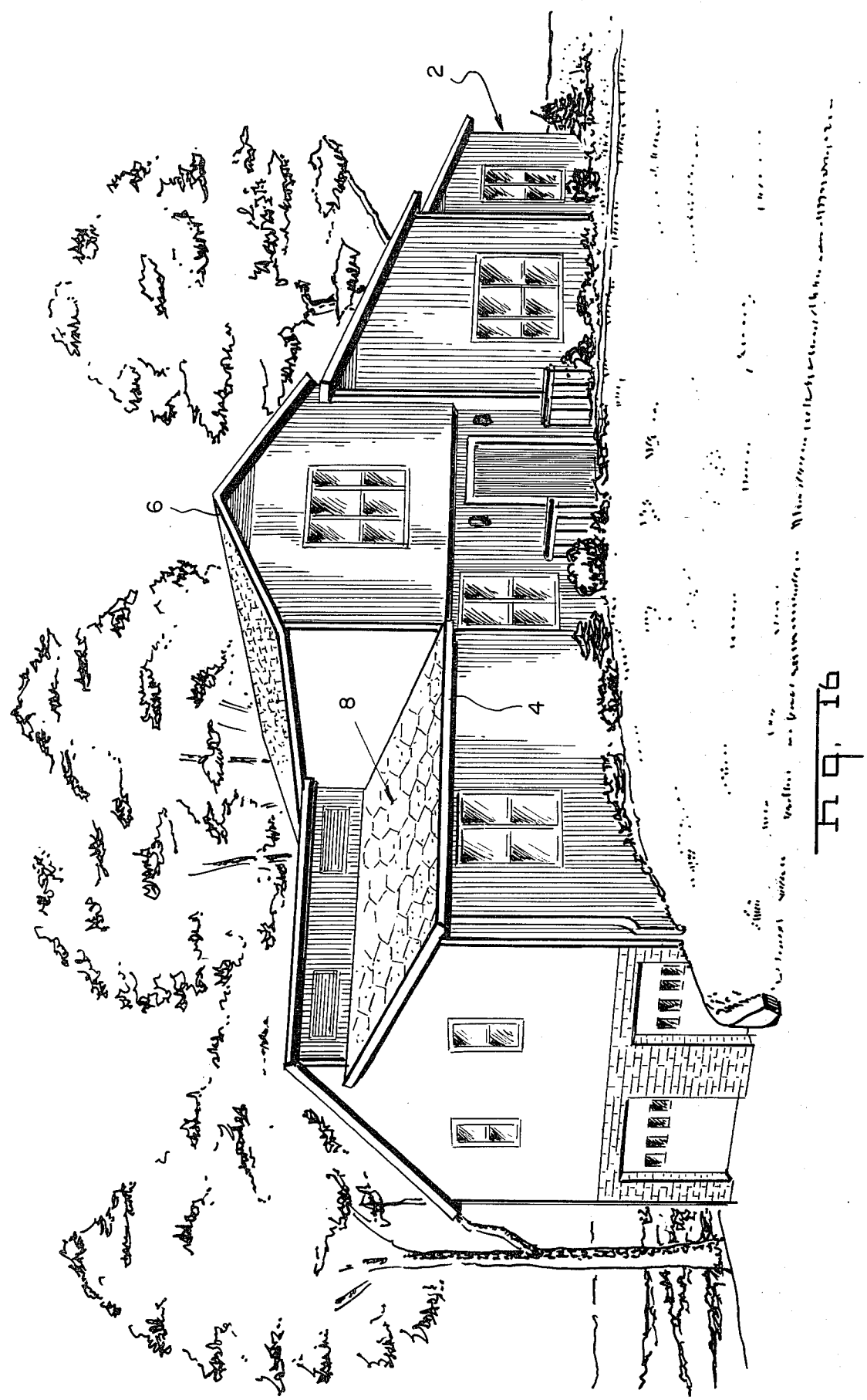

4,321,416

PHOTOVOLTAIC POWER GENERATION

FIELD OF THE INVENTION

This invention relates to photovoltaic modules and to improved photovoltaic generating systems having modules therein which can be individually removed for servicing or repair without disturbance to the remaining modules in the array.

BACKGROUND OF THE INVENTION

A substantial amount of research and development is presently being carried out for the purpose of producing practical and economical photovoltaic generating units. In general, photovoltaic generating units, as presently contemplated, will comprise a multiplicity of individual photovoltaic generating modules, each of which contains a plurality of individual photovoltaic cells. The modules are connected to each other in accordance with a predetermined wiring arrangement to produce electrical power at the main output terminals of the array of modules. The precise circuit arrangements employed will depend upon a number of considerations, such as the size of the system, the voltage desired at the output terminals of the system, and the nature of the installation, for example, whether the installation is provided on the roof of the building or on a support specifically constructed for the generating unit.

The electrical connections in the system between and among the modules is an important factor in the practicality of the system. The connections should be of reasonable cost, should be sealed against the elements, and should be of a nature such that the connections can be made by a mechanic of ordinary skill. It is also important that the generating unit, as a whole, be serviceable in the sense that individual modules can be removed for replacement or repair without disassembling the entire system. The present invention in accordance with one aspect thereof is directed to the achievement of improved photovoltaic modules which can be connected into the electrical network of a photovoltaic array with relative ease and which will satisfy all the requirements of the electrical connections for such systems.

One type of photovoltaic module presently being developed and tested is in the form of a roof shingle having an active portion in which the photovoltaic cells are positioned, and an inactive portion which partially surrounds the active portion. Shingles of this type are installed on a panel such as the roof of a building, in much the same manner as are ordinary shingles, and the photovoltaic shingles perform, in part at least, the ordinary functions of shingles as well as a photovoltaic function. In the installation of shingles on a building roof, it is therefore necessary to connect the terminals of the active portions of the shingles into the electrical network of the system and the technician installing the shingles must therefore make the electrical connections while the shingles are being installed. The electrical network for a photovoltaic system of this type may take different forms, as mentioned above, depending upon circumstances of use and other factors. In any event, it is desirable that the shingles be such that they can be connected in series with each other, in parallel, and in a wide variety of series-parallel combinations. The overall invention, in accordance with a further aspect thereof, is directed to the achievement of an improved photovoltaic shingle module and its methods of installing such modules on a surface to achieve a predetermined wiring arrangement for the modules.

A photovoltaic shingle in accordance with the invention has leads extending from its positive and negative terminals in the form of flat flexible ribbon-like conductors encased in suitable insulating plastic film. The conductors are of the type which can be connected to similar conductors by means of crimpable electrical connecting devices which, when crimped onto two such conductors, are flat and relatively thin. The individual shingles or modules can be connected to each other in series in the array of shingles by simply connecting the negative lead of each shingle to the positive lead of an adjacent shingle, or the shingles can be connected in parallel by connecting the negative and positive leads of shingles positioned in a column to two spaced-apart connecting conductors previously installed on the roof. In either event, bus conductors are provided to which all of the shingles are connected and which extend to a terminal area for the entire system.

The shingles are secured to the roof or other surface by means of fasteners which extend through oversize washers which are positioned against openings in the inactive portions of the shingles. The openings in the shingles have diameters greater than the diameters of the fasteners so that upon removal of the washers associated with an individual shingle, the shingle can be moved away from the fastener and the individual shingle can then be removed from the array for servicing or replacement.

DRAWINGS

FIG. 3 is a plan view of a roof having bus conductors and connecting conductors installed thereon in preparation for the later installation of shingle modules on the roof.

FIG. 4 is a view similar to FIG. 3 but showing the array partially installed on the roof.

FIG. 5 is a view on an enlarged scale illustrating the electrical connections of the final column of shingles and their connections to connecting and bus conductors.

FIG. 6 is a fragmentary perspective view illustrating the manner in which adjacent shingles are connected to the connecting conductors on the roof.

FIG. 7 is a view taken along the lines 7—7 of FIG. 6.

FIG. 8 is a perspective view showing a removable washer and roofing nail exploded from each other.

FIG. 9 is a view similar to FIG. 7 but with the retaining washers removed from beneath the nail.

FIG. 11 is a fragmentary view showing the manner of connecting individual modules in series.

FIG. 12 is a wiring diagram for the circuit arrangement shown in FIG. 11.

FIG. 13 is a schematic diagram for the circuit arrangement of FIG. 11.

FIG. 14 is a fragmentary perspective view of a connecting device crimped onto a lead extending from a photovoltaic module.

FIG. 15 is a perspective view of a connecting device for connecting the ends of flat flexible cables.

FIG. 16 is a perspective view of a dwelling having photovoltaic generating units on portions of its roof.

PREFERRED EMBODIMENT

FIG. 16 shows a dwelling 2 having a plurality of roof surfaces 4, 6 on which photovoltaic generating units 8 are provided. Ordinarily, and in the northern hemisphere, generating units will be installed only on surfaces directed towards the south, in order to achieve maximum efficiency. However, generating units are shown on more than one roof surface in FIG. 16 for purposes of illustration.

Figure 1:
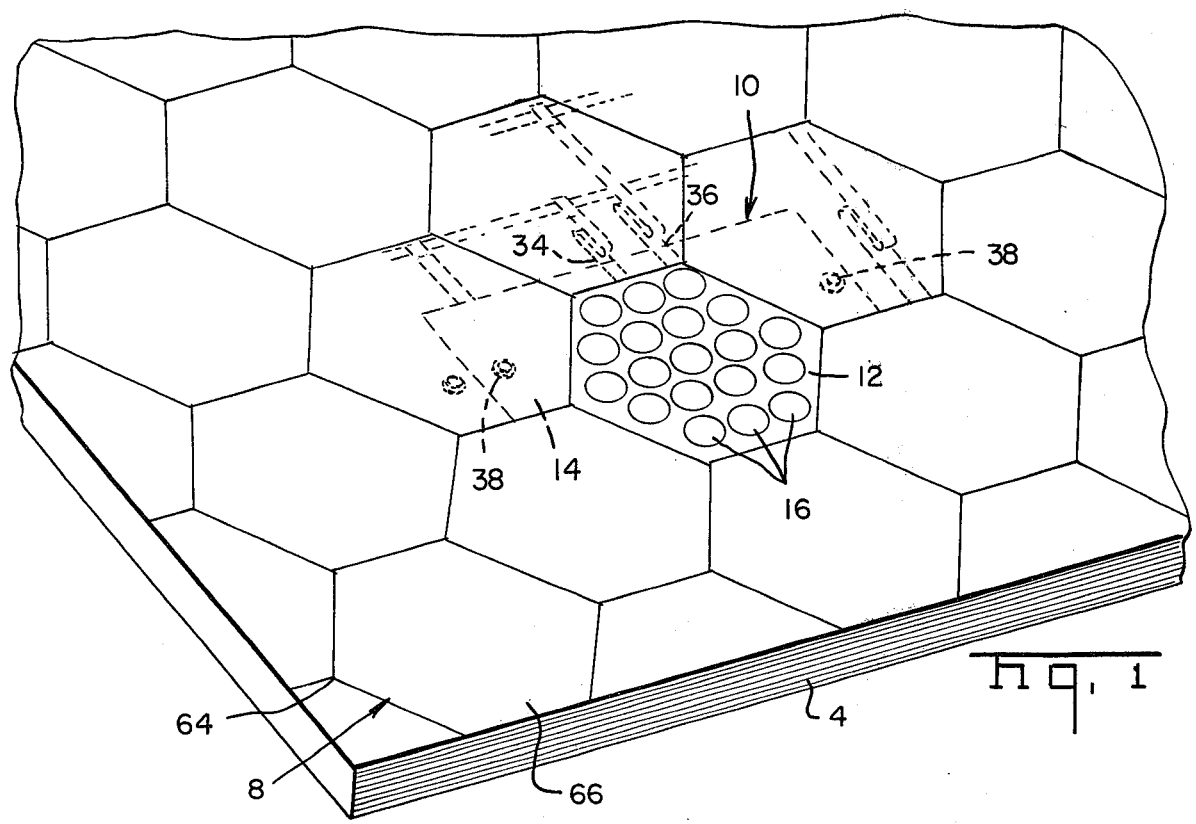
FIG. 1 is a fragmentary perspective view showing a portion of a roof having an array of shingle modules thereon in accordance with the invention.

The generating unit 8 is comprised of a plurality of modules 10, FIGS. 1 and 6, in the form of roof shingles. Each shingle comprises a hexagonal active portion 12 and an inactive portion 14. The active portion serves as a support for individual photovoltaic cells 16 and is therefore rigid, while the inactive portion 14 may be of conventional roofing material and has a degree of flexibility.

Shingles of the general type shown in FIG. 1 have been produced by the General Electric Corporation, Space Division, and are presently being tested. In accordance with prior art practice, shingles of the type shown were provided with leads encased entirely in the inactive portions 14 of the shingles and during installation, the leads were connected to the electrical network of the system by means of specialized fasteners or other devices which connected the leads within the active portions of the shingles to each other. This system was somewhat lacking in flexibility in the sense that there were only limited options available as regards the circuit arrangements which could be used with the shingles. Furthermore, removal of individual shingles presented a problem for the reason that the terminal connections between adjacent shingles were covered over by the active portions of adjacent shingles.

The active portion has exposed lower side edges 18, 20, 22 and upper side edges 24, 26, 28, as viewed in FIG. 6, which are surrounded by the inactive portion 14 of the shingle. The inactive portion has an upper edge 30 as viewed in the drawing, and side edges 32 which are dimensioned such that when the shingles are installed on the roof, the inactive portions will be entirely covered over by the active portions of adjacent shingles, as shown in FIG. 1.

Leads 34, 36 are connected to the terminals of the active portion and extend through the inactive portion 14 past the edge 30. In this description, it is assumed that the leads 34 which are on the left in the drawing, are the negative leads and the leads 36 are the positive leads.

The leads 34, 36 are of flat flexible ribbon-like conductors, preferably copper or aluminum, encased in a weather resistant insulating film. The modules, as mentioned, have the leads integral therewith and the length of the leads is such that upon installation of the modules on a roof, a service loop 48 can be provided in each lead. Since the conductors are flat and flexible and relatively thin, these servicing loops 48 can be formed in the leads by the technician at the time of installation and they will lie flat in the array so that they do not present any clearance problems.

Figure 2:
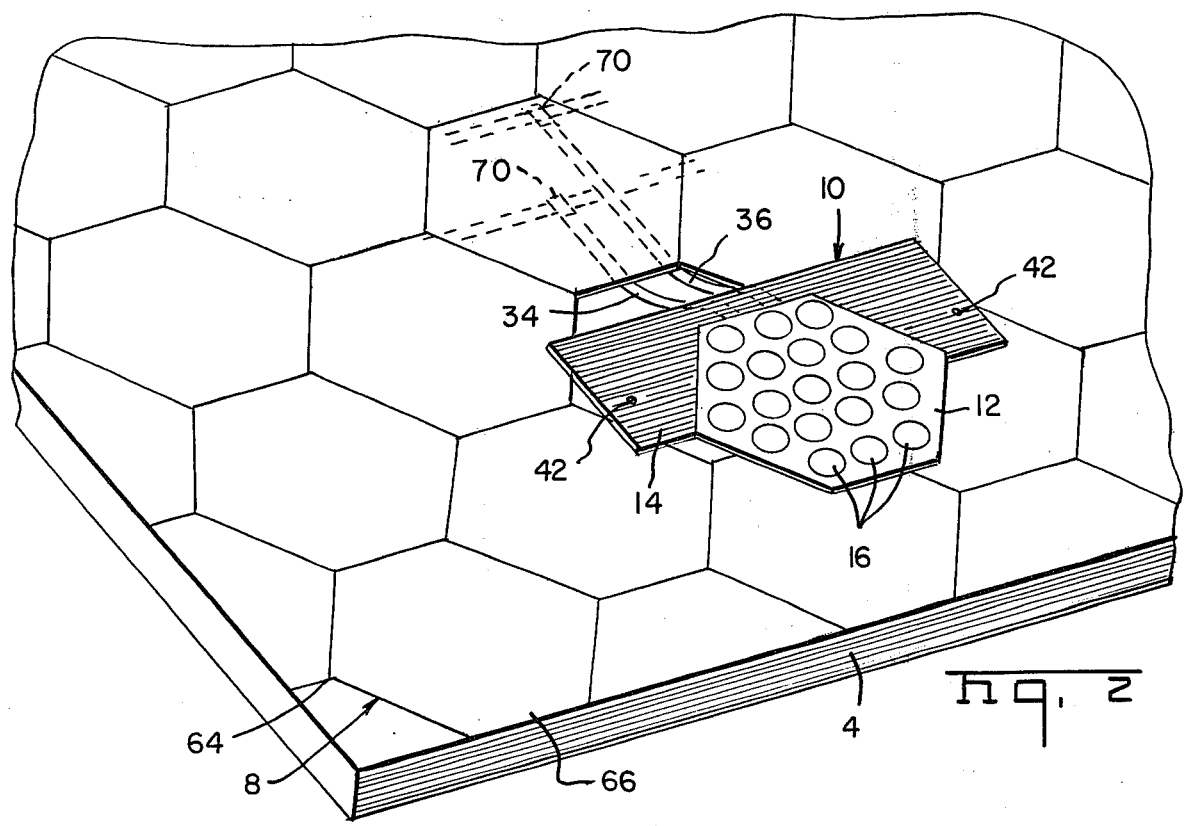
FIG. 2 is a view similar to FIG. 1 illustrating the manner of removing an individual shingle from the array.

The individual shingles are secured to the roof by means of conventional nails 38, and washers 40. The shingles are provided with openings 42 which have a diameter greater than the diameter of the head of the nail 38 so that the inactive portion of a shingle can be lifted from the surface of the roof and will pass over the head of the nail during removal. The washer 40 is interposed between the head of the nail and the surface of the inactive portion 14 of the shingle, as shown in FIG. 7, and the nail therefore, effectively retains the shingle on the roof. If it is desired to remove an individual shingle from the array, however, it is merely necessary to insert a flat blade-like tool having a hooked end beneath the active portion of an adjacent module and position the hooked end of the tool in an enclosed slot 46 in the washer 40. The washer can then be pulled out from under the nail by virtue of the provision of a radial slot 44 in the washer. After removal of the washer, the shingle can be carefully removed, as shown in FIG. 2, by lifting the active portion and sliding it out of its position in the array with accompanying straightening of the servicing loop 48 in the leads 34, 36. If it is necessary to replace a shingle, the leads are simply cut and the leads of a replacement shingle are spliced onto the original leads 34, 36 by connecting devices 70, discussed below.

Shingles as described above can be connected to each other on a roof or other surface at the time of installation by the mechanic installing the shingles with the aid of a relatively simple crimping tool. Moreover, any desired circuit arrangement can be achieved depending upon the manner in which the leads of the shingles are connected to each other. FIGS 3-5 illustrate the manner in which the shingles are installed to achieve a series-parallel circuit arrangement, while FIGS. 11-13 show a simple series arrangement.

When a series-parallel circuit arrangement is desired, the technician first installs positive and negative bus conductors 50, 52 (FIG. 3) adjacent to the lower and upper edges 54, 55 of the roof. The positive bus conductor 52 extends into a terminal area 58 in the upper lefthand corner of the roof, while the negative bus conductor 52 extends to the lefthand edge and then upwardly, as shown at 56, to the terminal area 58 of the system. The technician thereafter installs a plurality of connecting conductors 60 in spaced-apart relationship between the bus conductors 52, 50. The number of connecting conductors 60 will depend upon the number of shingles installed between the edges 54, 55 of the roof, but in any event, the number of connecting conductors 60 plus the bus conductors 50, 52 will always be an even number for reasons which will be apparent from the following description. Also, the spacing between adjacent connecting conductors and the spacing between the bus conductors and the connecting conductors which are adjacent to the bus conductors should be substantially equal to the distance between the lower edge 20 and the upper edge 30 of an individual shingle module. The conductors 50, 52 and 60 are all of the flat flexible type described above so that the leads from the shingles can be connected to these conductors by electrical connecting devices 70. It should also be mentioned that the bus conductors 50, 52 will ordinarily carry a higher current than will the connecting conductor 60. The bus conductors may therefore either be of a heavier gauge, or preferably, several conductors in parallel with each other may be provided for each bus 50, 52.

After installation of the connecting conductors and the bus conductor, the technician installs the individual shingles in columns and in rows, as shown in FIGS. 1 and 4. The columns 64 extend between the side edges 57 of the roof and the rows extend between the upper and lower edges 54, 55. Installation is carried out by first installing the column identified as 64-1, which is immediately adjacent to the lower edge 54. At the time of installation of columnd 64-1, the negative lead 34 of each shingle is connected to the bus conductor 50 and the positive lead 36 is connected to the connecting conductor 60-1 which is immediately adjacent to negative bus conductor 50. After installation of column 64-1, the technician installs the second column 64-2, by locating the active portion of the modules in column 64-2 between adjacent active portions of the modules in column 64-1. The negative leads of the modules in column 64-2 are connected to the same connecting conductor, identified in FIG. 4 as 60-1, as the positive leads of the modules in column 64-1 are connected to. The positive leads of the modules in column 64-2 are connected to the conductor 60-2, which is immediately adjacent to conductor 60-1. In like manner, the modules in the third column, 64-3 are installed above the second column and the negative leads in the modules in this column are connected to conductor 60-2, while the positive leads are connected to conductor 60-3.

The technician proceeds to install the succeeding columns in the same manner and during installation of the columns, the rows are formed by proper placement of the modules in the columns. The active portions of the modules in each column are offset from the active portions of the modules in adjacent columns and the active portions of the modules in each row are similarly offset from the active portions in adjacent rows so that, as previously mentioned, the surface of the fully installed array consists entirely of active portions of the individual shingle modules. The connections between the individual leads and the connecting conductors and the bus conductors can be made by any suitable crimpable connecting device for flat conductors. A preferred form of connecting device which can be crimped with a simple hand tool is disclosed in Application Ser. No. 43,966, filed May 30, 1979, now U.S. Pat. No. 4,263,474. It is desirable also to provide sealing means as shown at 68, in surrounding relationship to each of the crimped connections 70. This sealing means can take the form of a pad placed under each crimped connection and a covering film which is bonded to the pad after the conductors have been crimped to each other and the crimped connection is in place.

After all of the shingle modules are installed on the roof, a suitable adaptor connector can be connected in the terminal area 58 to the positive and negative terminals of the system. As previously mentioned, the bus conductors 50 and 52 can be either of a heavier gauge than the connecting conductors and the leads or preferably, several identical conductors can be provided for the bus conductors 50, 52 and the module leads selectively connected to these conductors to distribute the electrical load.

Figure 10:
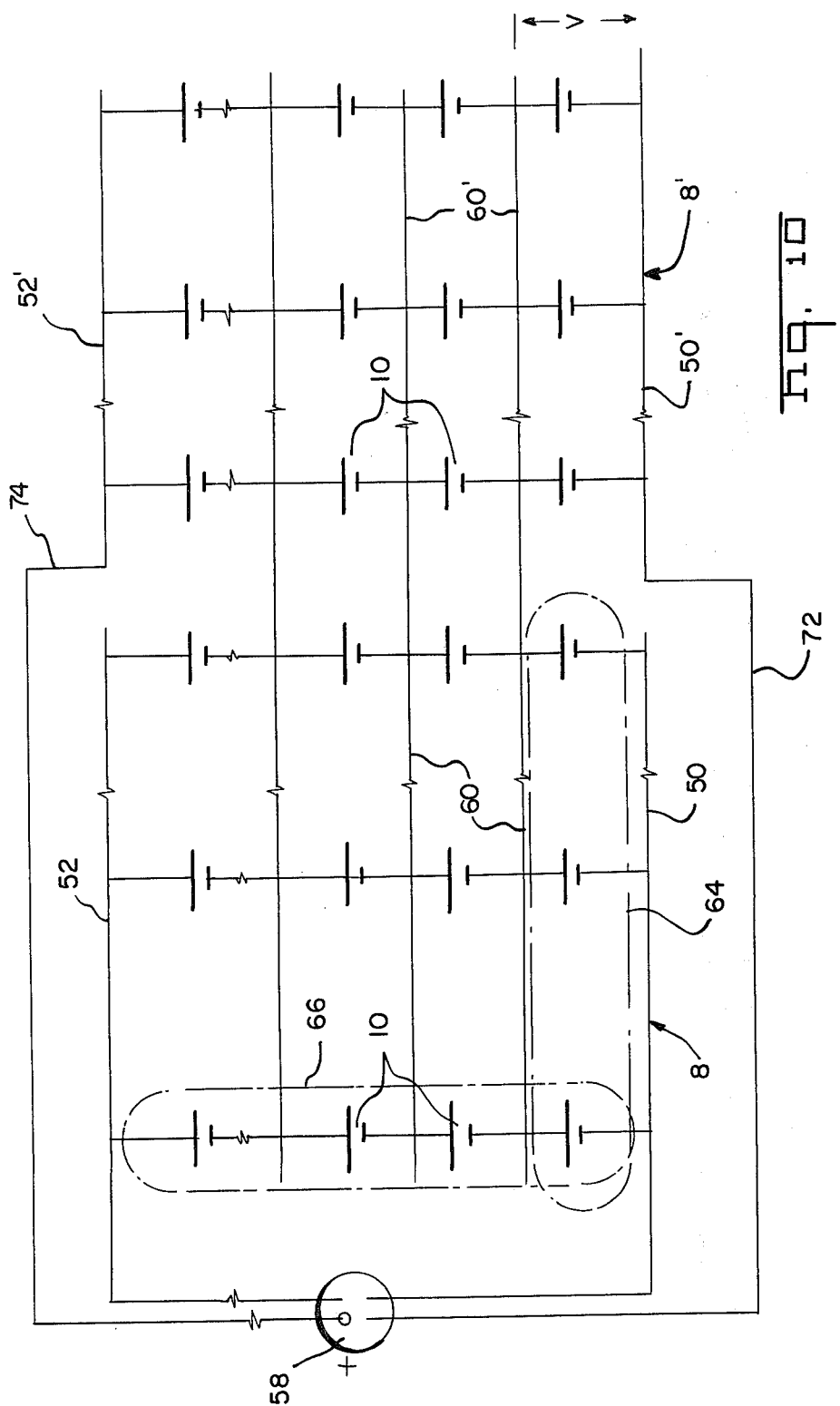
FIG. 10 is a schematic wiring diagram for a typical photovoltaic installation having the individual modules connected in a series-parallel arrangement.

FIG. 10 shows a schematic diagram for a system comprising a generating unit 8, as described above, and an additional generating unit 8' which is identical to the unit described above. As is apparent from this diagram, the individual modules are connected in series between the bus conductors 50, 52 of the unit 8 and the bus conductors 50', 52' of the unit 8'. However, the individual modules are also in parallel so that if an individual module fails, the output of the remaining modules in the row will not be lost. The individual module can then be replaced as explained above. In the circuit arrangement of FIG. 10, leads 72, 74 extend from the bus conductors 50', 52' to the terminal area 58 where, as mentioned above, an adaptor connector would be provided to conduct the output of the system to the load.

FIGS. 11-13 show a relatively simple series arrangement for the modules in which rows of individual modules extend between the bus conductors 50, 52. With this circuit arrangement, connecting conductors, as shown at 60 in the previous drawings, are not required and the positive lead of each module is directly connected to the negative lead of the next adjacent module. As shown in FIG. 11, the positive lead can be folded at 76 to direct it towards the end of the negative lead of the next adjacent module. Again, a servicing loop would be provided in each lead to permit removal of the individual modules from the array.

When the modules are connected in a series-parallel arrangement as shown in FIG. 4, it is convenient to crimp a connecting device 70 (FIGS. 14-15) onto the ends of the leads 34, 36 in the factory in which the modules are produced. The connecting device 70 has two crimp portions, the crimp portion 82 which is crimped onto the end of a lead and a crimp portion 84 which is crimped onto one of the crimping conductors or one of the bus conductors at the time of installation. The crimp portion 84 is thus in its uncrimped condition, as shown in FIG. 14, when the module is shipped from the factory.

If the modules are being connected in a simple series system, as illustrated in FIGS. 11-13, it is convenient to crimp a connecting device 70 onto only one of the leads 34, 36. For example, the connecting device can be crimped onto the negative lead 34 and when the end of the positive lead is connected to the negative lead, it is merely necessary only to position the end of the positive lead in the connecting device and crimp the upper end thereof, as shown at 84.

When an individual module is removed from the array and replaced, a connecting device, as shown at 86 in FIG. 15, is used. After removal of the module, the leads are severed adjacent to the inactive portion of the module and the leads from the replacement module are connected to the original leads by simply positioning one of the original leads and one of the leads from the new module in the crimp portions 88 of the connecting device and thereafter crimping the ends onto the leads. In FIG. 15, it is assumed that the connecting device shown is being crimped onto the positive lead of the new module and the cut off inactive lead 36 of the original module. The negative leads would be connected in the same manner.

It will be apparent that the principles of the invention permit the installation of the modules on a surface by means of relatively simple crimping operations that can be carried out by the technician who is also engaged in securing the inactive portions of the module to the roof surface. Moreover, any desired circuit arrangement can be achieved, series connections, parallel connections, or any desired combination thereof. The wiring plan for a desired circuit arrangement can be simply illustrated, as shown in FIGS. 11 and 12, so that the technician, when he installs the modules on the roof, will know precisely what connections he should make between and among the lead conductors and the connecting conductors where connecting conductors are used.

The principles of the invention can be used with modules other than the shingle type described in detail above. The advantages achieved by the folding of the leads at the time of installation and the advantages of leads of connection of the leads in the connector network would be equally attractive in a generating unit of the type comprising an array composed of rectangular modules having cells mounted thereon.

I claim:

1. A photovoltaic module of the type which is in the form of a roof shingle comprising an active portion and an inactive portion, said active portion having photovoltaic cells thereon, said inactive portion partially surrounding said active portion whereby a multiplicity of said shingles can be installed on a roof with said inactive portions overlapping, with said active portions exposed, and with said active portions connected to each other in accordance with a predetermined circuit arrangement thereby to provide a photovoltaic generating unit on said roof, said shingle being characterized in that:

said active portion has a positive lead and a negative lead extending therefrom, each of said leads comprising a flat flexible ribbon-like conductor encased in flexible insulating films, said leads having free ends which are intended for connection to conductors in said circuit arrangement, each of said leads having a length which is greater than the length required to connect said leads into said circuit arrangement by an amount which will provide a slack servicing loop between said active portion and said free ends whereby, after installation of a multiplicity of said shingles on a roof as an array, an individual shingle can be removed from said array without disconnecting said free ends from said circuit arrangement by moving said individual shingle from said array with accompanying straightening of said servicing loop.

2. A photovotaic module as set forth in claim 1, at least one of said leads having a connecting device crimped onto its end, said connecting device having an uncrimped portion for connecting said lead into a photovoltaic generating unit.

3. A photovoltaic module as set forth in claim 2, said leads being of unequal lengths.

4. A photovoltaic generating unit of the type comprising a supporting surface, an array of photovoltaic modules on said surface, each of said modules having a positive terminal and a negative terminal, said terminals of said modules in said array being interconnected by circuit conductors in accordance with a predetermined circuit arrangement, said generating unit being characterized in that:

said circuit conductors comprise positive and negative leads extending from said positive and negative terminals of each of said modules, said leads having ends which are connected to other conductors in said circuit arrangement, each of said leads comprising a flat flexible ribbon-like conductor encased in insulating plastic, each of said leads having a folded portion between its associated terminal and its free end to provide a slack servicing loop whereby, an individual module can be removed from said array without disconnecting said free ends of its leads by moving said module from said array with accompanying straightening of said servicing loop.

5. A photovoltaic generating unit as set forth in claim 4, each of said modules comprising a shingle adapted to be mounted on the roof of a building.

6. A photovoltaic generating unit as set forth in either of claims 4 or 5, said modules being arranged in columns and rows in said array, adjacent modules in said rows being connected to each other in series.

7. A photovoltaic generating unit as set forth in either of claims 4 or 5, said modules being arranged in columns and rows in said array, said circuit arrangement comprising a plurality of parallel spaced-apart connecting conductors extending parallel to said columns, said modules in each of said columns being commonly connected in parallel to predetermined connecting conductors.

8. A photovoltaic generating unit of the type comprising a support, an array of photovoltaic modules on said support, each module having a positive lead and a negative lead extending therefrom, said modules being electrically connected to each other in a series-parallel arrangement and being connected to positive and negative bus conductors, said generating unit being characterized in that:

said support has an even number plurality of of parallel spaced-apart connecting conductors thereon, the spacing between adjacent connecting conductors being substantially equal to one of the overall dimensions of one of said modules, said modules being installed on said support in covering relationship to said connecting conductors and being arranged in columns and rows, said columns extending parallel to said connecting conductors, said rows extending normally of said connecting conductors, said modules being oriented with said one overall dimension extending in the direction of said rows, all of said modules in each column having their negative leads connected to the same connecting conductor and having their positive leads connected to one of the adjacent connecting conductors, the modules in every other row having their leads of a first polarity connected to odd numbered connecting conductors and having their leads of the second polarity connected to even numbered connecting conductors, the modules in the remaining rows having their leads of the second polarity connected to odd numbered connecting conductors and having their leads of said first polarity connected to even numbered connecting conductors, the connecting conductor which is at the one side of said unit having negative leads only connected thereto, the connecting conductor which is at the other side of said unit having positive leads only connected thereto, said bus conductors being connected to said connecting conductors at said one side and at said other side whereby, all of said modules in each of said columns are connected in parallel and all of the modules in each pair of adjacent rows are connected in series.

9. A photovoltaic generating unit as set forth in claim 8, said connecting conductors and said positive and negative leads being flat ribbon-like conductors.

10. A photovoltaic generating unit as set forth in either of claims 8 or 9, said positive and negative leads each having an intermediate slack loop portion, said intermediate slack loop portion of each lead being between the module from which said lead extends and the connecting conductor to which said lead extends whereby said modules can be lifted from said array for servicing.

11. A photovoltaic generating unit as set forth in claim 10, each of said modules being of the type which is in the form of a shingle having an active portion and an inactive mounting portion, said active portion having photovoltaic cells therein, said modules being mounted on said support in an imbricated pattern with said mounting portions overlapping and covered by the active portions of aadjacent modules and with said active portions exposed, said leads of each module extending from said active portion thereof in the direction of the row in which said module is positioned to connecting conductors which are beneath the next adjacent module in the same row.

12. A photovoltaic generating unit as set forth in claim 11 and an additional photovoltaic generating unit which is similar to said photovoltaic generating unit, said photovoltaic generating unit and said additional photovoltaic generating unit being connected to each other as units.

13. A photovoltaic generating unit and an additional photovoltaic generating unit as set forth in claim 12, said units being connected in series.

14. A photovoltaic generating unit and an additional photovoltaic generating unit as set forth in claim 12, said units being connected in parallel.

15. A method of assembling a photovoltaic generating unit of the type comprising a support, an array of photovoltaic modules on said support, each module having a positive lead and a negative lead extending therefrom, said modules being electrically connected to each other in a series-parallel arrangement and being connected to positive and negative bus conductors, said method comprising the steps of:

installing an even number plurality of connecting conductors on said support in parallel spaced-apart relationship to each other, installing said modules on said support in covering relationship to said connecting conductors and, during installation of said modules, arranging said modules in columns which extend parallel to said connecting conductors and rows which extend transversely of said connecting conductors, during the installation of the modules in every other row, connecting the leads of a first polarity to associated odd numbered connecting conductors and connecting the leads of the second polarity to associated even numbered connecting conductors, during installation of the modules in the remaining rows, connecting the leads of the first polarity to associated even numbered connecting conductors and connecting the leads of the second polarity to associated odd numbered connecting conductors, connecting only negative leads of the modules in the column on one side of the unit to the connecting conductor on said one side and connecting only positive leads of the modules in the column on the other side of the unit to the connecting conductor on said other side of the unit.

16. A method of assembling a photovoltaic generating unit as set forth in claim 15 including the step of forming a slack loop in said positive and negative leads of each of said modules during installation of each module thereby to permit removal of individual modules from said array.

17. A method of assembling a photovoltaic generating unit as set forth in claim 16 in which said connecting conductors are flat ribbon-like conductors and said leads are connected to said connecting conductors by crimping connecting devices.

* * * * *